United States Patent [19]

Ina et al.

[11] Patent Number: 5,160,957
[45] Date of Patent: Nov. 3, 1992

[54] ALIGNMENT AND EXPOSURE APPARATUS

[75] Inventors: Hideki Ina, Kawasaki; Masao Kosugi, Yokohama; Akiyoshi Suzuki, Tokyo, all of Japan

[73] Assignee: Canon Kabushiki Kaisha, Tokyo, ; 5 07221992 10 099 11031992 JPX Japan 05091986 61-104843 27 1 1 Rutledge; D. Adams; Russell E. 7 10 1

[21] Appl. No.: 795,252

[22] Filed: Nov. 19, 1991

Related U.S. Application Data

[63] Continuation of Ser. No. 692,980, Apr. 29, 1991, abandoned, which is a continuation of Ser. No. 481,695, Feb. 20, 1990, abandoned, which is a continuation of Ser. No. 273,149, Nov. 18, 1988, abandoned, which is a continuation of Ser. No. 46,446, May 6, 1987, abandoned.

[30] Foreign Application Priority Data

May 9, 1986 [JP] Japan .................. 61-104843

[51] Int. Cl.⁵ .................. G03B 27/42; G03B 27/53
[52] U.S. Cl. .................. 355/43; 355/53
[58] Field of Search .................. 355/43–45, 355/53, 77; 356/400, 401; 219/121.68, 121.82, 121.69

[56] References Cited

U.S. PATENT DOCUMENTS

| 4,402,596 | 9/1983 | Kanatani | 355/53 |
| 4,405,229 | 9/1983 | Mayer | 355/53 X |
| 4,422,755 | 12/1983 | Phillips | 355/45 |
| 4,473,293 | 9/1984 | Phillips | 355/53 |
| 4,641,035 | 2/1987 | Suzuki et al. | 356/400 X |
| 4,679,942 | 7/1987 | Suwa et al. | 356/401 |
| 4,741,622 | 5/1988 | Suwa et al. | 356/401 |
| 4,752,668 | 6/1988 | Rosenfield et al. | 219/121.68 |

FOREIGN PATENT DOCUMENTS 61-73329  4/1986  Japan .
61-114529 6/1986  Japan .

OTHER PUBLICATIONS

"Photo-etching of PMMA by Excimer Laser Irradiation", Study on Laser; vol. 8, No. 6, pp. 941–943.
"Photoablation of Resist Coated Alignment Targets to Improve VLSI Pattern Overlay", Lasers in Microlithography, SPIE, vol. 774 (1987) pp. 172–180.
"Lithographic Trends", Semiconductor International vol. 23 Dec. 1986.

Primary Examiner—Russell E. Adams
Assistant Examiner—D. Rutledge
Attorney, Agent, or Firm—Fitzpatrick, Cella, Harper & Scinto

[57] ABSTRACT

A mark detecting device usable in an alignment and exposure apparatus for aligning an alignment mark of a mask with an alignment mark of a wafer and for exposing a resist layer provided on the surface of the wafer to a pattern of the mask with radiation. The device including a portion for forming a photoprint of the alignment mark of the mask on the resist layer provided on the surface of the wafer, a portion for removing at least a portion of the resist layer adjacent to the alignment mark of the wafer, and a portion for detecting the alignment mark of the wafer and the photoprint of the alignment mark of the mask.

27 Claims, 7 Drawing Sheets

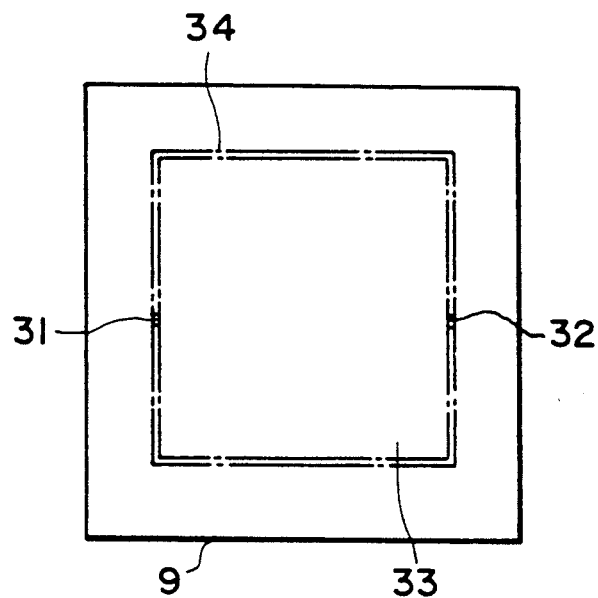
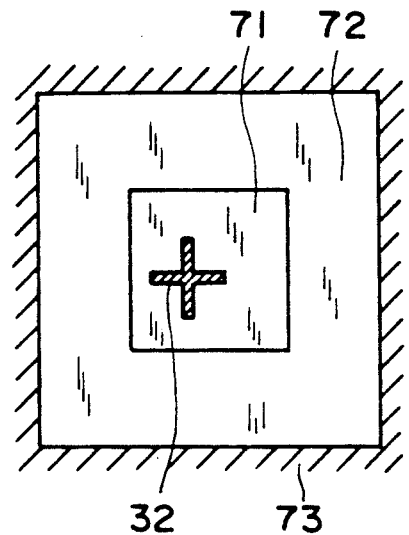
FIG. 4A  FIG. 4B
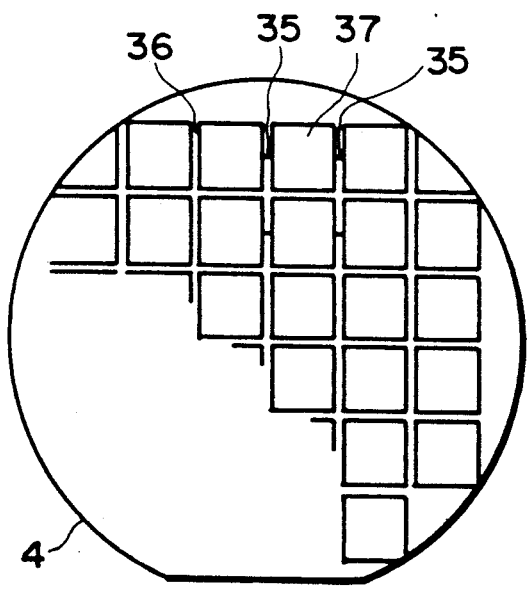
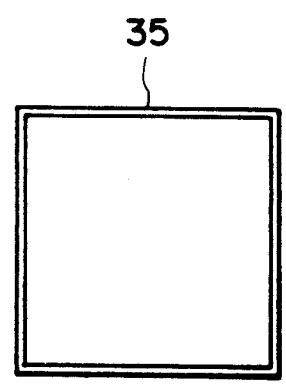
FIG. 5A  FIG. 5B

ALIGNMENT AND EXPOSURE APPARATUS

This application is a continuation of application Ser. No. 07/692,980 filed Apr. 29, 1991, now abandoned; which is a continuation of application Ser. No. 07/481,695 filed Feb. 20, 1990, now abandoned; which is a continuation of application Ser. No. 07/273,149 filed Nov. 18, 1988, now abandoned; which is a continuation of application Ser. No. 07/046,446 filed May 6, 1987, now abandoned.

FIELD OF THE INVENTION AND RELATED ART

This invention relates generally to an alignment and exposure apparatus for use in a photolithographic process which is one of the manufacturing processes for semiconductor devices such as integrated circuits (ICs), large scaled integrated circuits (LSIs), etc. More particularly, the invention is concerned with a projection type exposure apparatus having a projection optical system for projecting a pattern of a reticle onto a semiconductor wafer, and an alignment system usable for aligning the reticle pattern and a pattern previously photoprinted on the wafer.

Resolution and alignment accuracy are basic performance requirements in alignment and exposure apparatuses used in the field of manufacturing semiconductor devices. Also, throughput (processing ability) will be an essential performance in the point that the alignment and exposure apparatuses are productive machines. The tendency to further miniaturization and higher capacity of semiconductor devices has enforced further improvements in the resolution and alignment accuracy. Depending on an exposure process adopted, the alignment and exposure apparatuses are classified into a contact exposure type, a proximity exposure type, a 1:1 mirror projection exposure type, a lens projection exposure type, etc. Reduction lens projection type exposure apparatuses (called "steppers") have become prevalent because of their capabilities of transferring more fine circuit patterns. Since advantages in the reduction lens projection type exposure systems in respect to the resolution have already been fully discussed in various printed publications, description thereof will be omitted here. However, examination made by Applicants of such lens projection type exposure systems has revealed that there still remain serious problems in respect to the alignment accuracy. That is, many lens projection type exposure systems employ such an alignment system which uses a light beam having a wavelength other than that of a light beam used for the exposure of a semiconductor wafer. To the contrary, the projection lens is usually designed such that the imaging performances and correction of aberration are assured only with respect to one particular wavelength which is, usually, that of the exposure light.

In view of the above, various measures have been proposed and taken to overcome the problems caused by using different wavelengths. However, it has been found that these measures themselves cause additional errors in relation to the alignment accuracy.

These errors are:

(A) An error due to the intervention of an intermediate reference or references, with respect to which alignment marks of a reticle (or mask) and a wafer are aligned to indirectly bring them into alignment with each other;

(B) An error due to an insufficient accuracy in the displacement of the wafer and/or the reticle during a time period from the alignment to the exposure;

(C) An error with respect to the displacement caused by any change in temperature of the components, vibration or the like during the time period from the alignment to the exposure;

(D) An error due to any differences in the optical path length with respect to the light beams used for the alignment and the exposure, respectively; etc.

While it is possible to suppress these errors to some degree, it is not easy to stably maintain these errors at minimum levels.

U.S. Pat. No. 4,521,082, corresponding to Japanese Laid-Open Patent Application, Laid-Open No. 25638/1983, assigned to the same assignee of the subject application discloses an improved alignment and exposure system in which a light source for the alignment comprises an He-Cd laser providing a wavelength of 442 nm which is very close to the wavelength of exposure light (e.g. the g-line having a wavelength of 436 nm), and in which a projection lens is designed so that the aberrations are corrected with respect to these two wavelengths. With such arrangement, the above-described errors (A)–(D) can be obviated.

However, there still remains a problem such as follows:

As is known in the art, it is desired to suppress a standing-wave effect which occurs in a photoresist material applied to the wafer, in order to effectively utilize the resolving power of the projection lens. For this purpose, it has been proposed to subject the wafer surface to an anti-reflection treatment or to add a light-absorbing agent to the resist material. As a further alternative, it has been proposed to use a multi-layer structure for the resist layer. Such techniques will become more and more important in view of recent trends of further miniaturization and higher capacities of the semiconductor devices. If these processes are adopted, it may not be so easy to obtain signals from the wafer during the alignment operation using a wavelength equal to or close to that used for the exposure.

As a solution for these problems, a proposal has been made in Japanese Laid-Open Patent Application, Laid-Open No. 114529/1986 filed in the name of the assignee of the subject application. This Japanese Patent Application discloses a unique and improved alignment and exposure method and apparatus which is effective to suppress various errors peculiar to conventional alignment systems such as described in the foregoing and which can meet with the use of a light-absorptive resist material or a multi-layer resist layer.

The principle of alignment disclosed in this Japanese application is applicable not only to ordinary lens projection type exposure systems but also to lens projection type exposure systems and mirror projection type exposure systems using shorter wavelengths, as well as X-ray exposure apparatuses.

Briefly, according to the proposal made in this Japanese application, there is provided an alignment and exposure method and apparatus for aligning a pattern of a mask or reticle with a pattern of a wafer and for transferring the pattern of the mask onto a resist layer formed on the surface of the wafer, wherein a small portion of the resist layer on the wafer in the vicinity of an alignment mark formed on the wafer is exposed to light passed through a small portion of the mask including an alignment mark formed on the mask, thereby to form an image of the alignment mark of the mask on the resist layer of the wafer, the image of the alignment mark of the mask formed on the resist layer of the wafer and the alignment mark formed on the wafer being detected so as to detect any positional deviation between the image and the alignment mark formed on the wafer, at least one of the mask and the wafer being displaced on the basis of the result of detection, and finally the resist layer of the wafer being exposed to light passed through a portion of the mask including the pattern.

In summary, according to the proposed alignment principle, any local change in the resist layer resulting from the exposure is detected as a signal related to the mask.

More specifically, when the resist material is irradiated with light, there occurs an opto-chemical reaction in the resist material. Also, in respect to an optical phenomenon, the irradiation causes changes in the transmission factor and in the refractive index of the resist material. Depending on the kind of the resist material used, it also causes expansion or contraction of the resist material which results in formation of a stepped portion at the boundary between the irradiated area and the non-irradiated area. For an ordinarily used OFPR resist or AZ resist material, for example, the result of such selective exposure or irradiation can be observed through a microscope and under a white light, as an image defined by the difference in brightness when viewed. More particularly, when the resist material is selectively or partially exposed to light, the transmission factor of the exposed portion of the resist material increases as the result of exposure. Therefore, the exposed area of the resist material can be observed as a bright area as compared with the non-exposed area, even if the resist material is not yet subjected to a "developing" process. Thus, an image is observable on the resist material after the selective exposure and before the development. Hereinafter, such image formed only by the exposure (i.e. without development) will conveniently be referred to as a "latent image".

The proposed alignment method uses such "latent image" for the sake of the alignment between the reticle (or mask) and the wafer.

That is, when any latent image of a reticle is just formed on a resist layer of a wafer by means of an exposure optical system, the thus formed latent image does not contain any error in relation to the reticle. In other words, the latent image formed by the exposure optical system bears exact positional information with respect to the reticle by way of the exposure optical system. It follows therefrom that, if any positional deviation between the latent image formed on the resist layer and a reference preparatively formed on the substrate of the wafer is detected, the positional relation between the reticle and the wafer by way of the exposure optical system can be very exactly detected. According to the proposed alignment method, in view of the above, a latent image of an alignment mark of a reticle is formed on a resist layer of a wafer, preferably at a position in close vicinity of an alignment mark preparatively formed on the substrate of the wafer, and the positional deviation between the latent image thus formed on the resist layer and the alignment mark of the wafer is detected to thereby detect the positional relation between the reticle and the wafer. This assures extraordinarily accurate and stable detection of the positional relation between the reticle and the wafer, without being affected by the exposure optical system, since the detection of the positional deviation between the latent image and the alignment mark of the wafer is exactly equivalent to detection of the positional relation between two juxtaposed images formed on the same object.

FIG. 7A of the accompanying drawings shows an alignment and exposure apparatus arranged in accordance with the proposed principle.

As shown in FIG. 7A, the main assembly of the exposure apparatus is carried by a surface plate 1. Disposed on the surface plate 1 is a wafer stage 2 which supports a wafer holder 3 and a wafer 4 held on the holder 3 by vacuum suction or the like. The stage 2 supports the holder 3 and the wafer 4 for movement in a plane perpendicular to an optical axis of a projection lens system 5, by means of a drive unit (not shown) of known type. The wafer stage 2 has formed thereon a mirror 6 on which a beam 7 from an unshown laser interferometer is incident, whereby the position of the wafer stage 2 can be detected in a known manner and whereby the movement of the wafer stage 2 can be controlled also in a known manner. Located above the projection lens system 5 is a reticle 9 held by a reticle holder 8. The holder 8 is movable in a plane perpendicular to the optical axis of the projection lens system 5 by means of a drive unit (not shown) of known type. Disposed above the reticle 9 is an illumination optical system generally denoted at reference A. When a light beam is supplied to the reticle 9 from the illumination optical system A, a pattern formed on the reticle 9 is transferred by means of the projection lens system 5 onto the surface of the wafer 4.

The illumination optical system A comprises a light source 10 such as a super Hg lamp, first to third condenser lenses 11-13 provided to uniformly illuminate the surface of the reticle 9 with a light supplied by the light source 10, first and second mirrors 14 and 15 provided to bend or deflect the light beam, and a shutter 16 for controlling the exposure.

The second and third condenser lenses 12 and 13 and the second mirror 15 are arranged to cooperate with each other so as to bring a plane B into an optically conjugate relation with a pattern bearing surface 17 of reticle 9. Accordingly, by disposing an appropriate masking member on the plane B, only a desired area of the reticle 9 can be illuminated. Actually, a masking member 18 is disposed on the plane B. As is best seen in FIG. 7B, the masking member 18 includes two masks 19 and 20 which are held by a common frame member. The mask 19 is provided for the sake of selective exposure of only a circuit pattern area of the reticle 9, while the mask 20 is provided for the sake of selective exposure of only alignment mark areas of the reticle 9, as will be described later. An actuator 21 (FIG. 7A) such as a combination of a cylinder and a plunger is coupled to the masking member 18 to move the masking member 18 along the plane B, so that the masks 19 and 20 are interchangeably disposed in the path of the flux of light reflected from the first mirror 14.

FIG. 7B shows details of the masking member 18 adapted to be used with the reticle 9 of FIG. 7A for the sake of selective exposure thereof. As described hereinbefore, the masking member 18 includes the mask 19 which is arranged for the sake of exposure of only the circuit pattern area of the reticle 9, and the mask 20 which is arranged for the sake of selective exposure of only small portions of the reticle 9 including alignment marks. As shown in FIG. 7B, the mask 19 has a light-transmitting area of square shape, corresponding to the circuit pattern area of the reticle 9, and a light-blocking area defined at the peripheral portion of the light-transmitting area. On the other hand, the mask 20 has two small light-transmitting areas 38 (which hereinafter "windows") each having a square shape as illustrated. The remaining area of the mask 20 forms a light-blocking portion. The windows 38 are disposed so that, when the mask 20 is introduced into the optical path such as shown in FIG. 7A, these windows 38 are imaged on small portions of the surface of the reticle 9 including the alignment marks of the reticle, respectively. Also, the shape and size of each of the windows 38 are selected to assure that the light beam passed therethrough is incident on the portion of the reticle 9 surface fully including the whole of an associated one of the alignment marks of the reticle 9. Each of the masks 19 and 20 may be formed by selectively coating a transparent glass substrate with a chromium material for the sake of selective interception of the light at the reticle 9.

The alignment and exposure apparatus further includes an alignment optical system generally denoted at reference C in FIG. 7A. As shown in this Figure, the alignment optical system C is disposed in such manner that a portion thereof is inserted into a space between the projection lens system 5 and the wafer 4. The alignment optical system C includes a light source 22 such as a halogen lamp. The light beam emitted from the light source 22 is condensed by a condensing mirror 23 and a condenser lens 24 and, after passing through a half prism 25 and an objective lens 26, is incident on a movable mirror 27. The mirror 27 is movable between a solid line position and a broken line position. At the broken line position, the mirror 27 is inclined at an angle of 45 degrees with respect to the optical axis of the projection lens system 5. At this position, the mirror 27 is effective to reflect the light beam incident thereon toward the wafer 4 surface to illuminate it. The light beam incident on the wafer 4 surface is reflected thereby and the reflected light beam is directed to the half prism 25 by way of the movable mirror 27 and the objective lens 26. The light beam incident on the half prism 25 is reflected upwardly by the prism 25, so the light beam after passing through a relay lens 28 is focused on a surface 30 of an image pickup tube 29. By this, an image of a portion of the wafer 4 is formed on the image pickup surface 30.

Preferably, the light source 22 produces a light beam to which a photoresist material applied to the wafer 4 surface is not sensitive. If a light beam produced by any light source used contains such component to which the photoresist material used is sensitive, a filter may be used to intercept the sensitizing component.

While only one portion of the alignment optical system C is illustrated in FIG. 7A, the alignment and exposure apparatus of this example actually includes two sets of alignment optical systems so as to detect the positional relation between the reticle 9 and the wafer 4 at two points. The two-point detection is preferably because it allows ready and accurate alignment between the reticle 9 and the wafer 4 in X, Y and $\theta$ axes which are three orthogonal directions, only by displacement of at least one of the reticle 9 and the wafer 4 in a plane perpendicular to the optical axis of the projection lens system 5.

For the formation of latent images of the reticle alignment marks on the resist layer which is provided on the wafer 4 surface, the shutter 16 is actuated to allow passage of the light beam to the reticle 9. At this time, the mask 20 for the selective exposure of the alignment marks of the reticle 9 has already been initially set at the position shown in FIG. 7A. Therefore, only small portions of the reticle 9 containing the alignment marks are irradiated with the light beams passed through the windows 38 of the mask 20 shown in FIG. 7B. The light beams passed through the alignment mark portions of the reticle 9 are projected upon the wafer 4 by the projection lens system 5. In other words, portions of the wafer 4 surface are exposed to the light beams passed through the alignment mark portions of the reticle 9. By this, latent images of the reticle alignment marks are formed on or in the resist layer of the wafer 4 at positions close to the wafer alignment marks, respectively.

Each of the thus formed latent images is an image of one reticle alignment mark as projected upon the resist layer provided on the wafer. Thus, the latent image bears exact positional information concerning the "position" of the reticle alignment mark as being projected upon the wafer. Accordingly, by relatively moving the reticle and the wafer so as to relatively align the latent images of the reticle alignment marks with corresponding wafer alignment marks, high-accuracy alignment of the reticle and the wafer substantially free from such alignment errors as described hereinbefore is attainable.

However, there still remains a problem caused by the existence of the photoresist material on the wafer. That is, the thickness of the resist layer provided on the wafer is not exactly uniform because the wafer alignment mark is usually provided by a step (recess or protrusion). Such uneven or irregular resist coating provided on the wafer surface easily affects the alignment accuracy, more particularly the mark detecting accuracy.

SUMMARY OF THE INVENTION

It is accordingly a primary object of the present invention to provide an improved alignment method and apparatus of the type using the latent image for the alignment of two objects such as a reticle and a wafer.

It is another object of the present invention to provide an improved alignment method and apparatus which avoids adverse effects of an uneven photoresist coating and which thereby assures high-accuracy alignment.

In accordance with one preferred form of the present invention, to achieve these objects, there is provided an alignment method and apparatus wherein a latent image of a mask pattern (mask alignment mark) is formed on or in a resist layer provided on the surface of a wafer; wherein the latent image of the mask pattern and an alignment mark of the wafer are observed; wherein the mask and the wafer are aligned in accordance with the result of observation; wherein after completion of the alignment the wafer is exposed to a circuit pattern of the mask; and wherein prior to the execution of mark observation, a portion of the resist layer covering the wafer alignment mark is removed preparatorily.

Also, in accordance with another preferred form of the present invention, the removal of the resist material as described above is accomplished by over-exposing a desired portion of the resist coating. By such over-exposure, the resist material of such portion is removed by vaporization.

The removal of the resist material as described allows direct observation of the wafer alignment mark, i.e. not by way of the photoresist layer. Therefore, the position of the wafer alignment mark can be detected very accurately, without being affected by the photoresist coating which is usually uneven.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4A is a plan view of a reticle usable in the apparatus of FIG. 2.

FIG. 4B is an enlarged and schematic plan view, showing the manner of exposure of an alignment mark provided on the reticle of FIG. 4A.

FIG. 5 is a plan view of a wafer used in an embodiment of the present invention.

FIG. 5A is an enlarged plan view showing one of the alignment marks formed on the wafer of FIG. 5A.

DESCRIPTION OF THE PREFERRED EMBODIMENTS

For the alignment of a reticle and a wafer, in the present invention, means is provided to suitably form a latent image of an alignment mark of the reticle on or in a photoresist coating of the wafer and, additionally, means is provided to suitably detect the latent image of the reticle alignment mark and an alignment mark provided on the wafer. For the formation of the latent image, radiation energy such as typically a light having a wavelength or wavelength range to which the resist material used is sensitive is used. By suitably controlling the radiation energy or light quantity impinging upon the photoresist material, an appropriate, i.e. sufficiently observable "latent image" of the reticle alignment mark is formed on or in the resist coating. Since the latent image so formed is an image formed on or in a sensitive material such as the photoresist material, the latent image used in the present invention can be called a "photoprint" of the reticle alignment mark.

Figure 2:
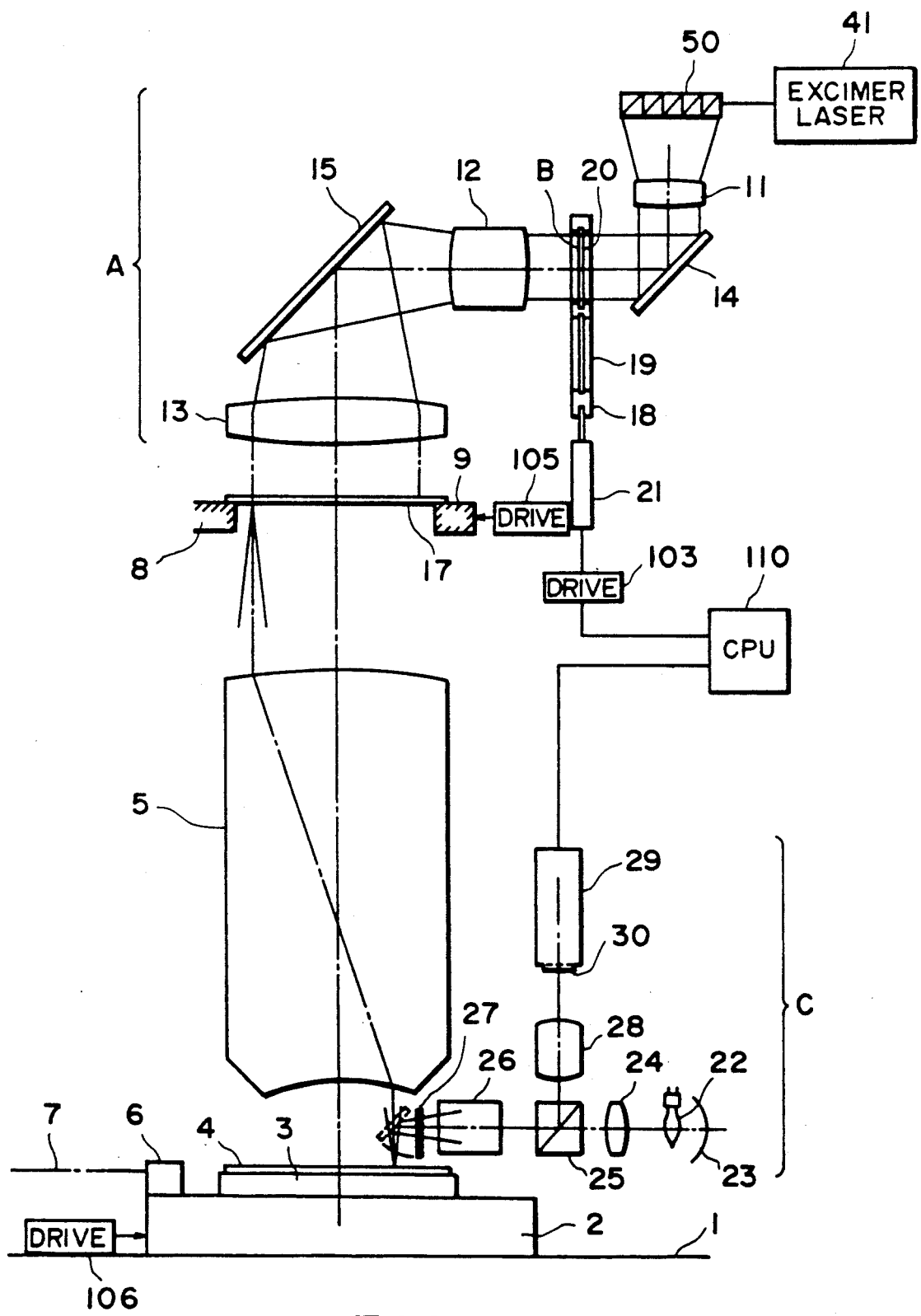
FIG. 2 is a schematic and diagrammatic view of an alignment and exposure apparatus of a reduction projection type, called "stepper", arranged in accordance with to an embodiment of the present invention.

Referring now to FIG. 2, there is shown an alignment and exposure apparatus of reduction projection type, called "stepper", according to one embodiment of the present invention.

As shown in FIG. 2, the main assembly of the exposure apparatus is carried by a surface plate 1. Disposed on the surface plate 1 is a wafer stage 2 which supports a wafer holder 3 and a wafer 4, the latter being held on the holder 3 by vacuum suction or the like. The stage 2 supports the holder 3 and the wafer 4 for movement in a plane perpendicular to an optical axis of a projection lens system 5. The wafer stage 2 has formed thereon an optical mirror 6 on which a beam 7 from a laser interferometer (not shown) is incident, whereby the position of the wafer stage 2 can be detected in a known manner and whereby the movement of the wafer stage 2 can be controlled also in a known manner. Disposed above the projection lens system 5 is a reticle 9 which is held by a reticle holder 8. Also, disposed above the article 9 is an illumination optical system which is generally denoted at reference A. When a light beam is supplied to the reticle 9 from the illumination optical system A, a pattern formed on the reticle 9 is transferred by means of the projection lens system 5 onto the surface of the wafer 4.

The illumination optical system A comprises a high-power light source 41 such as an excimer laser; first, second and third condenser lenses 11, 12 and 13 which are cooperable to uniformly illuminate the surface of the reticle 9 with the light emitted from the excimer laser 41; and first and second mirrors 14 and 15 each for bending or deflecting the light beam. Denoted in FIG. 2 at 50 is a fly's eye lens system. The lens system 50 may be replaced by a well-known type optical system adapted to convert the light into an incoherent light.

The second and third condenser lenses 12 and 13 and the second mirror 15 are designed to cooperate with each other to define a plane, at the position denoted by reference B, which is optically conjugate with a pattern bearing surface 17 of a reticle 9. By placing a desired masking member in the plane B, only a desired portion or portions of the reticle 9 can be illuminated. In this embodiment, a masking member 18 having two masks (i.e. a pattern exposing mask 19 and an alignment mark exposing mask 20) is used, the masking member 18 being disposed in the plane B and being driven by an actuator 21 so that the masks 19 and 20 are interchangeably disposed in the path of the flux of light reflected from the mirror 14.

The alignment and exposure apparatus further includes an alignment optical system generally denoted at reference C in FIG. 2. As shown in this Figure, the alignment optical system C is disposed in such manner that a portion thereof is inserted into a space defined between the projection lens system 5 and the wafer 4. The alignment optical system C includes a light source 22 such as a halogen lamp. The light beam emitted from the light source 22 is condensed by a condensing mirror 23 and a condenser lens 24 and, after passing through a half prism 25 and an objective lens 26, is incident upon a movable mirror 27. The mirror 27 is movable between a solid line position and a broken line position. At the broken line position, the mirror 27 is inclined at an angle of 45 degrees with respect to the optical axis of the projection lens system 5 and is effective to reflect the light beam from the objective lens 26 toward the wafer 4 surface to illuminate it. The light beam incident upon the wafer 4 is reflected thereby and the reflected light beam is directed to the half prism 25 by way of the movable mirror 27 and the objective lens 26. The light beam incident on the half prism 25 is reflected upwardly by the prism 25, so that the light beam after being passed through a relay lens 28 is focused on a surface 30 of an image pickup tube 29. By this, an image of a portion of the wafer 4 is formed on the image pickup surface 30 of the image pickup tube 29.

For the reticle-to-wafer alignment in three directions such as X, Y and θ (rotational) directions, plural-point position detection is desirable. Accordingly, the reticle 9 used in the present embodiment is formed typically with two alignment marks while, on the other hand, each of the shot areas defined on the wafer 4 is formed typically with two alignment marks. For the alignment mark detection purpose, accordingly, the alignment optical system C is provided with two objective lens systems, although only one is illustrated in FIG. 2.

The operation of the actuator 21 is controlled by a central processing unit 110 (hereinafter "CPU") by way of a driver 103. Also, the movement of the mirror 27 is controlled under the influence of the CPU 110. The imagewise information of the wafer as obtained at the image pickup surface 30 of the image pickup tube 29 is supplied from the tube 29 to the CPU 110. In the CPU 110, the imagewise information is subjected to the image processing which is known per se, whereby positional information concerning the reticle and wafer alignment marks is obtained. In accordance with the thus obtained positional information, the CPU 110 produces control signals and supplies them to drivers 105 and 106 so as to controllably move the reticle holder 8 and the wafer stage 2, respectively, by necessary amounts.

FIG. 4A shows an example of a reticle 9 (or mask) usable in the apparatus of FIG. 2. As shown in FIG. 4A, the reticle 9 has two alignment marks 31 and 32, one of which is illustrated in an enlarged scale in FIG. 4B. In the illustrated example, each reticle alignment mark may be provided by a light-intercepting region having a shape of a cross, as best seen in FIG. 4B. Also, the reticle 9 has a circuit pattern region 33 in which a circuit pattern for the manufacture of semiconductor devices, in this example, is formed. Denoted at numeral 34 is a region in which the alignment marks are formed.

FIG. 5A shows an example of layout of the shot areas defined on the wafer 4. Denoted in this Figure by numerals 35—35 are alignment marks; by 36, scribe lines; and by 37, shot areas (the regions in which device patterns are to be formed). In this example, each of the wafer alignment marks has a configuration, such as illustrated in an enlarged plan view of FIG. 5B, which may be defined by a protrusion or a recess.

In the alignment and exposure apparatus of the FIG. 2 embodiment, a high-power light source such as the excimer laser 41 is used as a source of the exposure beam, both for the formation of the latent images (photoprints) of the reticle alignment marks and for the reproduction of the reticle circuit pattern on the wafer. Further, the excimer laser 41 is used to remove portions of the photoresist coating on the wafer which portions cover the wafer alignment marks, respectively. This will now be described in more detail.

Figure 7A:
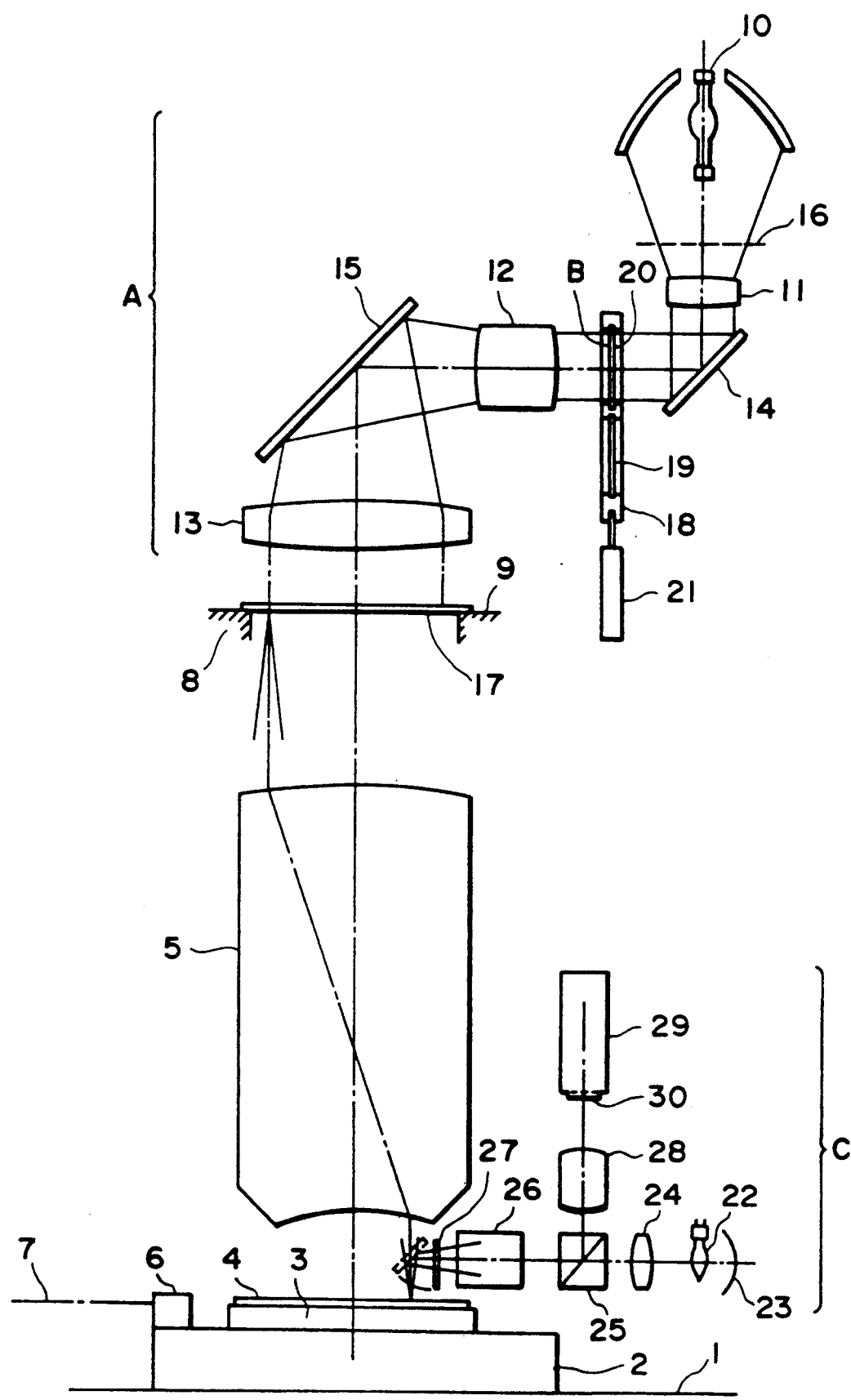
FIG. 7A is a schematic view of an alignment and exposure apparatus of the type disclosed in the aforementioned Japanese Laid-Open Patent Application.
Figure 7B:
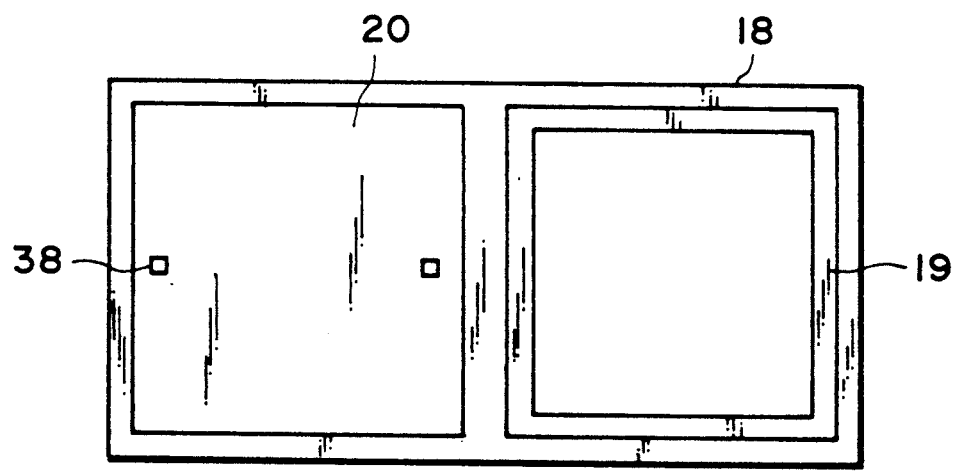
FIG. 7B is a plan view of a masking member used in the apparatus of FIG. 7A, for the selective exposure of a reticle.

The alignment-mark exposing mask 20 used in the present embodiment has a structure different from that of the mask 20 shown in FIG. 7B. The mask 20 of the present embodiment comprises a glass substrate coated with a light-intercepting material. In such light-intercepting surface of the mask 20, two small light-transmitting windows each having a rectangular shape are formed. Each of these windows is defined by an outer portion having a high transmission factor and an inner portion having a lower transmission factor.

Since the mask 20 when it is used is disposed in an optical conjugate relation with the pattern bearing surface of the reticle 9, the images of the windows of the mask 20 are formed on the reticle 9. The positions of these windows of the mask 20 are so determined that, when the images of the windows are formed on the reticle, each of the alignment marks of the reticle is included in the inner portion of the corresponding one of the images of the windows of the mask 20. Also, the positions of these windows are so determined that, when the light passing through the reticle 9 is imaged upon the wafer 4, the image of the outer portion of each window sufficiently covers corresponding wafer alignment mark.

The state of such image formation upon the reticle 9 surface with respect to one (32) of the reticle alignment marks is illustrated in FIG. 4B. In this Figure, a reference numeral 71 denotes the image of the inner portion of one of the windows of the mask 20, as formed on the reticle 9 surface, and another reference numeral 72 denotes the image of the outer portion of the one window. Reference numeral 73 depicts the region as fully shaded by the mask 20. On the other hand, the state of image formation of the wafer 4 surface is illustrated schematically in FIG. 1. In this Figure, reference character RD denotes a region which corresponds to an image of the region 72 shown in FIG. 4B; reference character M denotes a region which corresponds to an image of the region 71 shown in FIG. 4B; reference character W denotes a wafer alignment mark; and reference character R denotes an image of the reticle alignment mark.

In operation, the laser beam emitted from the excimer laser 41 and passed through the aforesaid one window of the mask 20 is incident upon the reticle 9 portion including the alignment mark 32. At this time, in the region 72 outside the region 71, the reticle 9 is exposed to a higher-intensity laser beam having been transmitted to the outer portion of the window of the mask. On the other hand, in the region 71, the reticle 9 is exposed to a lower-intensity laser beam having been passed through the inner portion of the window of the mask 20.

The intensity of the excimer laser beam and the transmission factors of the inner and outer portions of each window of the mask 20 are so determined that, when the wafer 4 is exposed to the light passed through the reticle 9, the portion of the wafer including the wafer alignment mark (i.e. the region RD in FIG. 1 corresponding to the image of the region 72 in FIG. 4B) is "over-exposed" while the portion of the wafer on which the image of the region 71 is formed (i.e. the region M in FIG. 1) is exposed by a suitable amount. As described hereinbefore, each reticle alignment mark may be provided, in this embodiment, by a light-intercepting pattern. Thus, the region R of the wafer shown in FIG. 1 that corresponds to the transferred image of the reticle mark may be the unexposed region.

When a wafer coated with a photoresist material is irradiated with a high-power laser beam such as the excimer laser beam, the portion of the resist material having been irradiated with the beam can be vaporized and scattered, like a case where the photoresist coating is irradiated with electron beams. Thus, it is possible to remove a desired portion of the resist coating by the laser beam irradiation. Also, by suitably adjusting the laser power at this time, the degree of removal can be controlled as desired. Although it is possible that the resist material adjacent to the portion being irradiated is carbonized to produce a carbon-rich material. However, this can be prevented by effecting the laser irradiation in an ambience of oxygen because, in such case, the carbon-rich material will be is changed into a gas of CO, $CO_2$, etc.

In the present embodiment, the intensity of the excimer laser beam irradiating the reticle alignment mark such as at 32 in FIG. 4B is made reduced by means of the alignment mark exposing mask 20 (FIG. 2), more particularly the inner portion of the window thereof, to a level that provides an optimum amount of exposure for the sensitization of the photoresist material used of a degree suitable for the formation of the "photoprint" of the reticle alignment mark. On the other hand, higher intensity of the excimer laser beam is used to irradiate the wafer alignment mark such as at 35 in FIG. 5B by way of the outer portion of the window of the mask 20. By doing so, the portion of the photoresist material which is provided on the region RD (FIG. 1) including the wafer alignment mark W is removed suitably. On the other hand, there still remains the photoresist material in the region M, inside the wafer alignment mark W and, more particularly, inside the region RD, as a result of the partial masking by the alignment mark exposing mask 20. This photoresist remaining region M is a portion having been exposed to the excimer laser beam, which has passed through the lower-transparency portion of the alignment mark exposing mask 20 such that the intensity of which has been decreased to a level providing the optimum amount of exposure. Since the reticle alignment mark such as at 32 in FIG. 4B may be made by a light-intercepting material, the reticle alignment mark is transferred onto the region M as the image R shown in FIG. 1. Namely, a latent image (photoprint) of the reticle alignment mark is formed on or in the photoresist layer of the wafer, such as denoted at R in FIG. 1.

Figure 1:
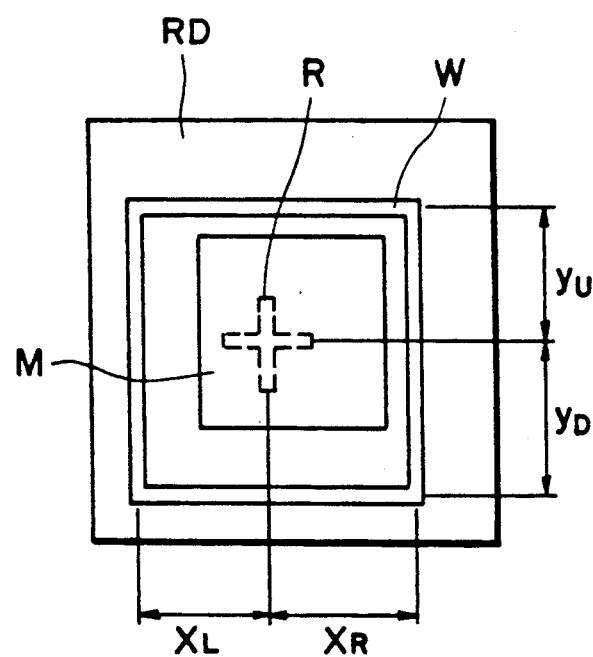
FIG. 1 is a schematic plan view of an alignment mark of a wafer and a latent image of an alignment mark of a reticle formed by an alignment operation in accordance with an embodiment of the present invention.

Then, by measuring or detecting the intervals $x_L$, $x_R$, $y_U$ and $y_D$ as depicted in FIG. 1, the positional deviations $\Delta X$ and $\Delta Y$ between one of the two wafer alignment marks and the latent image of corresponding one of the reticle alignment marks, with respect to the X and Y directions, can be calculated in accordance with the following equations:

$$\Delta X = (x_L - x_R)/2$$

$$\Delta Y = (y_U - y_D)/2$$

Since, in this embodiment, the positional relation between the reticle 9 and the wafer 4 is detected at two points with the use of two reticle alignment marks and two wafer alignment marks, four values $\Delta X_R$, $\Delta Y_R$, $\Delta X_L$ and $\Delta Y_L$ are obtainable. In accordance with the result of such calculations, the reticle holder 8 and/or the wafer stage 2 is moved to thereby accomplish the alignment.

Figure 3:
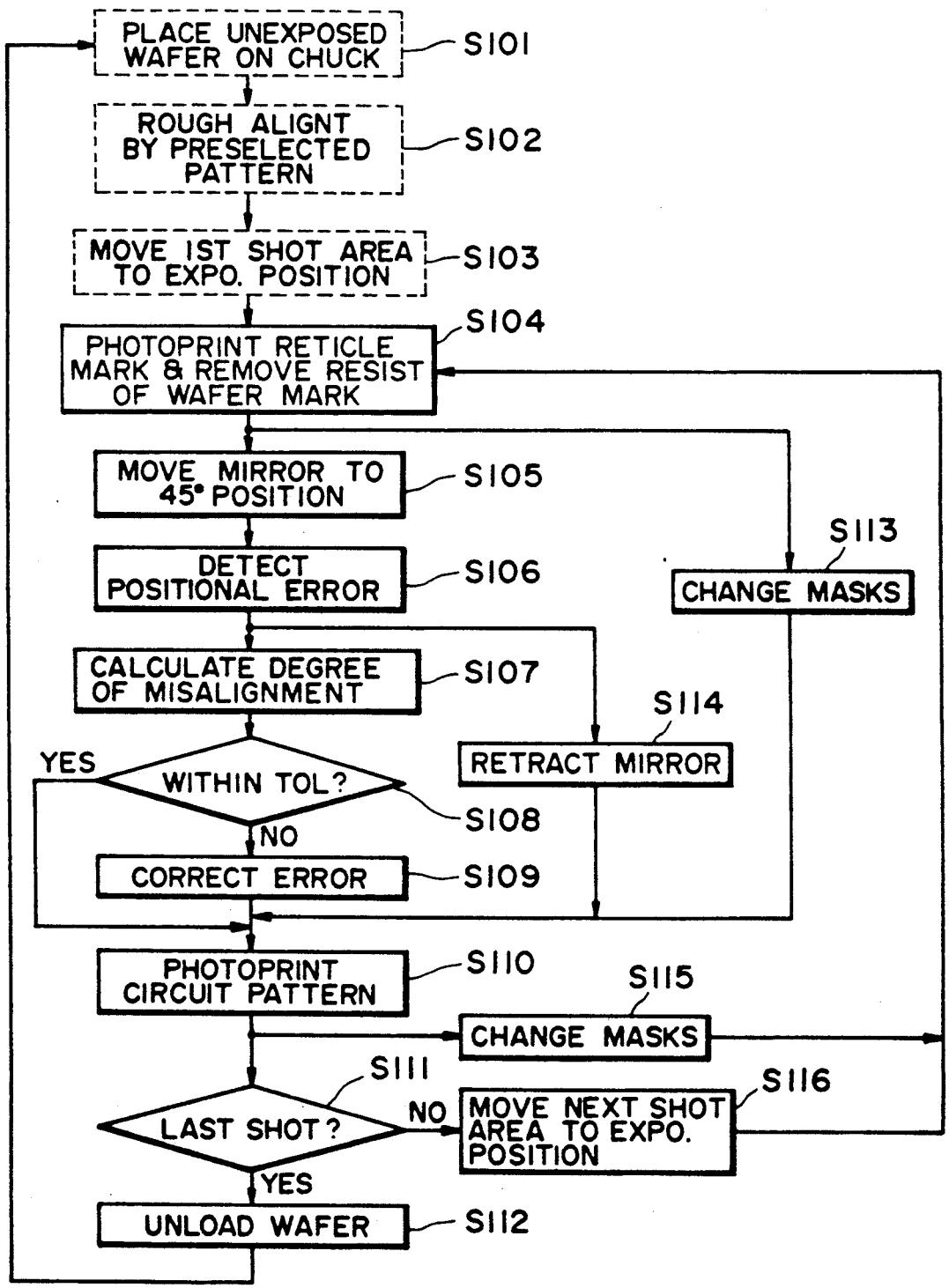
FIG. 3 is a flow chart showing a step-and-repeat alignment and exposure operation made in the apparatus of FIG. 2.

FIG. 3 is a flow chart showing the step-and-repeat alignment and exposure operation. At Step S101, an unexposed wafer is placed on the wafer holder (wafer chuck). Then, at Step S102, the wafer is coarsely aligned by use of an off-axis alignment scope in this example. More particularly, a preselected pattern, which in this example comprises a prealignment mark formed on the wafer, is observed by the alignment scope for this purpose. Subsequently, at Step S103, the wafer stage is driven to move the first shot area of the wafer to the exposure position under the projection lens system. Then, at Step S104, only the alignment mark portions of the reticle are exposed to the light from the exposure light source, whereby latent images of the reticle alignment marks are formed on the wafer. Also, the alignment mark portions of the wafer are exposed to a suitable quantity of the laser beam so that the resist material thereon is removed by a desired amount. Then, the swingable mirror is moved to its 45-degree position (Step S105), and the circuit-pattern exposing mask is set in place of the alignment-mark exposing mask (Step S113). In the similar manner as has been described, the detection of the positional error (Step S106), the calculation of the degree of misalignment (Step S107), the discrimination of the positional error (Step S108), the correction of the positional error (Step S109) and the regular exposure for reproducing the circuit pattern on the wafer (Step S110) are executed. Before the regular exposure, the swingable mirror is retracted out of the optical path defined for the exposure beam (Step S114). After the regular exposure, the alignment-mark exposing mask is set in place of the circuit-pattern exposing mask (Step S115). Further, discrimination is made at Step S111 as to whether the current shot (the shot area just having been exposed) is the last shot. If so, the wafer is unloaded (Step S112). If not so, the wafer stage is driven to move the next shot area of the wafer to the exposure position (Step S116).

The latent image R (FIG. 1) of the reticle alignment mark does not have a "sharp edge" in the sense of an edge of a wafer alignment mark which is usually provided by a recess or protrusion formed on the wafer surface. Accordingly, it is preferable to detect the latent image in a bright field. On the other hand, the wafer alignment mark W may be detected either in a bright field or in a dark field.

Figure 6:
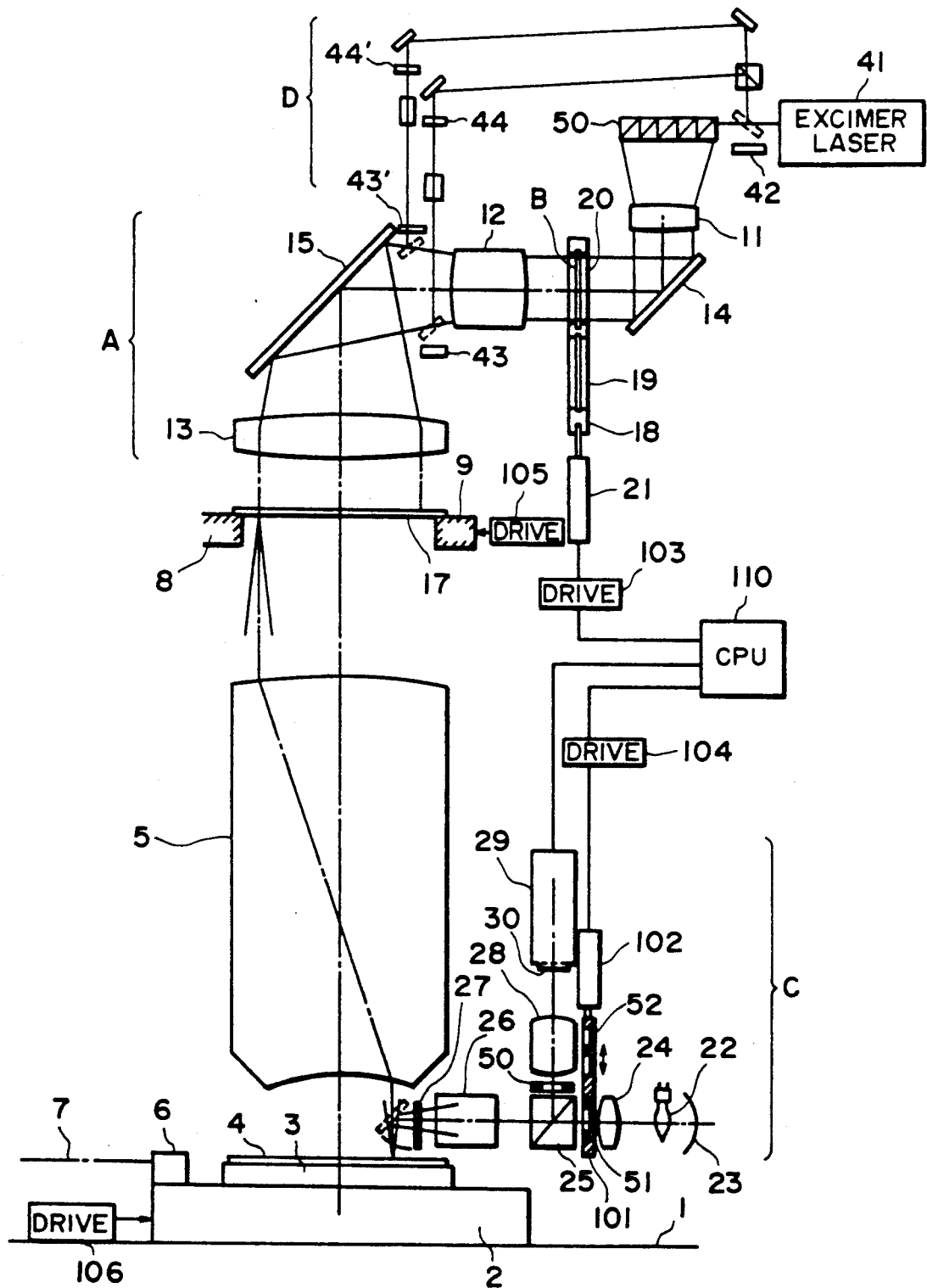
FIG. 6 is a schematic and diagrammatic view of an alignment and exposure apparatus of a reduction projection type, arranged in accordance with another embodiment of the present invention.

Referring now to FIG. 6, there is shown an alignment and exposure apparatus according to another embodiment of the present invention. In FIG. 6, like numerals as of the FIG. 2 embodiment are assigned to similar or corresponding elements.

In the embodiment shown in FIG. 6, the alignment optical system C is provided with a spatial filter such as a stop 50 which is disposed in a pupil plane of the alignment microscope system C. The stop 50 functions to restrict or determine the numerical aperture (NA) for the light reception. Also, the illumination optical portion of the alignment optical system C is provided with a bright-field stop 51 and a dark-field stop 52 both of which may be disposed in another pupil plane of the alignment optical system C. The stop 51 is usable to conduct bright-field illumination and has a central transparent portion and a peripheral non-transparent portion. As compared therewith, the stop 52 is usable to conduct dark-field illumination and has a central non-transparent portion and a peripheral transparent portion. The stops 51 and 52 are supported by a movable holder 101 which is arranged to be driven by an actuator 102 in the directions denoted by a double-headed arrow.

By means of this actuator 102, the bright-field stop 51 and the dark-field stop 52 are interchangeably introduced into the optical path of an illumination optical portion of the off-axis microscope system C. More specifically, for the detection of latent images of reticle alignment marks, the stop 51 is introduced so as to establish the bright-field illumination. For the detection of wafer alignment marks, on the other hand, the stop 52 is introduced in place of the stop 51 to allow detection of the wafer alignment marks in the dark field. The operation of the actuator 102 is controlled by a central processing unit 110 by way of a driver 104.

When the present invention is applied to a reduction projection type alignment and exposure apparatus, such as in the cases of the FIGS. 2 and 6 embodiments, the alignment operation using latent images of reticle alignment marks described hereinbefore may of course be executed for every shot area of each wafer. However, it is a possible alternative to execute the alignment using the latent images, with respect to some of the shot areas of the wafer, only. As for the remaining shot areas, in such case, the alignment may be achieved on the basis of the preparatorily stored positional information concerning these shot areas and in accordance with the measurement of the position of the wafer stage. That is, the alignment for these shot areas may be executed without their observation of the alignment marks. If this is done, the throughput of the apparatus can be improved significantly.

Moreover, it is within the scope of the present invention to execute different operations in parallel. That is, in the present invention, at least three important steps such as follows are included:

(a) Removal of the photoresist material and formation of the latent image (pre-exposure);
(b) Detection of positional deviation between the wafer alignment mark and the latent image of the reticle alignment mark; and
(c) Regular exposure for transferring the circuit pattern on the wafer.

All of or two of these steps may be performed in parallel. For example, during the pre-exposure at step (a) for a certain shot area, the deviation measurement at step (b) for the preceding shot area may be executed. Also, during the regular exposure at step (c) for a certain shot area, the deviation measurement at step (b) for a different shot area may be executed. By doing so, the throughput of the apparatus can be improved significantly.

In order to allow such "parallel working", at least some of the optical elements of the alignment optical system C of the FIG. 2 embodiment may be displaced when a certain shot area of the wafer is positioned in an illumination region defined by the illumination optical system A, such that alignment marks of an adjacent shot area, for example, can be illuminated and detected by the alignment optical system C. As an alternative, after completion of the pre-exposure of a particular shot area by means of the illumination optical system A, the wafer may be moved so that the particular shot area may be moved to the position as can be observed by the alignment optical system C while a different shot area may be moved into the illumination region of the illumination optical system A. Then, the deviation measurement (b) may be executed for the particular shot area on one hand, while the pre-exposure (a) or the regular exposure (c) may be executed for the different shot area on the other hand. The distance through which the wafer stage has been moved for the above purpose can be stored into suitable memory means. After completion of both the deviation measurement (b) for the particular shot area and the exposure of the different shot area, the wafer stage may be moved in accordance with the result of deviation measurement and with the stored information concerning the distance of movement of the wafer stage, so as to move back the particular shot area to the illumination region defined by the illumination optical system A. Thereafter, the regular exposure of the particular shot area may be executed. By doing so, high-precision positioning is attainable regardless of the separation of the pre-exposure position and the deviation measuring position.

While, in the foregoing embodiments, the removal of the resist material covering the wafer alignment mark is accomplished by using, in the illumination optical systems, a mask member having different transmission factors, the invention is not limited to use of such mask member. For example, an auxiliary illumination optical system, having a simple masking member that shows transmissibility only in the regions corresponding to the wafer alignment marks, may be provided exclusively for the resist removing purpose. This allows that the mask, such as at 20 in FIG. 2 which is disposed in the illumination optical system for the latent image formation (the illumination optical system in this embodiment being used also as an illumination system for the photoprinting of the circuit pattern), has the same or uniform transmission factor for exposure of the wafer alignment mark and the reticle alignment mark. Also, the intensity of the light beam to be projected upon the reticle 9 by way of the mask 20 may be of a uniform level that provides the optimum amount of exposure for the formation of the "photoprint" on the photoresist material used. It is to be noted that the removal of the photoresist material covering the wafer alignment mark by use of such auxiliary illumination system may be either before or after the formation of the latent image.

The arrangement shown in FIG. 6 includes an example of such auxiliary illumination system.

In the alignment and exposure apparatus of the FIG. 6 embodiment, the CPU 110 produces instruction signals, at the time of removal of the resist material, so as to move a switching mirror 42 to its broken line position. At the same time, under the influence of the CPU 110, mirrors 43 and 43' are moved to their broken line positions in synchronism with the movement of the mirror 42. By doing so, the laser beam emitted from the excimer laser 41 can be introduced into the auxiliary illumination system D with the aid of the switching mirror 42. In this illumination system D, two masks 44 and 44' are provided at positions each being in an imaging relation with the wafer 4, as in the case of the mask 20 of the illumination system A. Further, each of these masks 44 and 44' is arranged so that, in a direction perpendicular to the optical axis, only the wafer alignment mark portion is irradiated with the laser beam while the reticle alignment mark is not irradiated with the laser beam. By use of such illumination system D, the laser beams from the excimer laser 41 are projected upon only the wafer alignment mark portions, whereby the resist materials of these portions are removed by vaporization. Subsequently, the mirrors 42, 43 and 43' are moved to their solid line positions, and the reticle alignment marks are photoprinted on the wafer to thereby form latent images of the reticle alignment marks on the wafer. In this manner, as illustrated in FIG. 1, each of the wafer alignment marks is deprived of its resist material while, on the other hand, the latent images of the reticle alignment marks are formed in the neighborhood of the wafer alignment marks.

While the invention has been described with reference to the structures disclosed herein, it is not confined to the details set forth and this application is intended to cover such modifications or changes as may come within the purposes of the improvements or the scope of the following claims.

What is claimed is:

1. A mark detecting device usable in an alignment and exposure apparatus for aligning an alignment mark of a mask with an alignment mark of a wafer and for exposing a resist material layer provided on the surface of the wafer to a pattern of the mask with radiation, said device comprising:

latent image forming means forming a latent image of the alignment mark of the mask on the resist material layer provided on the surface of the wafer by use of first radiation from a radiation source;

removing means for removing at least a portion of the resist material layer on the alignment mark of the wafer by use of second radiation from a radiation source; and means for detecting the alignment mark of the wafer, the resist material of which has been at least partially removed by the irradiation with the second radiation, and the latent image of the alignment mark of the mask formed by said latent image forming means, wherein said first radiation and said second radiation are supplied from a common radiation energy source.

2. A device according to claim 1, wherein said latent image forming means is arranged to project light as the first radiation upon the resist layer so as to optically project, upon the resist layer, an image of the alignment mark of the mask by use of light of a predetermined intensity and wherein said removing means is arranged to project, upon the resist layer, light as the second radiation of an intensity which is higher than said predetermined intensity.

3. A device according to claim 2, wherein said radiation of said latent image forming means is usable to photolithographically transfer the pattern of the mask onto the wafer.

4. A device according to claim 3, wherein said latent image forming means includes variably setting means for variably setting an illumination region on the resist material layer, which region is to be irradiated with the radiation from said radiation source, and wherein said variably setting means is arranged to set different illumination regions for the formation of the latent image and for the transfer of the pattern of the mask.

5. A device according to claim 1, wherein the amount of irradiation by said first radiation is smaller than that by said second radiation.

6. A device according to claim 1, wherein said second radiation is provided by an excimer laser producing a laser beam.

7. A device according to claim 1, wherein said removing means is operative to remove at least a portion of the resist material layer on the alignment mark of the wafer by vaporization of resist material, comprising the resist material layer, with irradiation with a radiation energy.

8. A mark detecting method usable in an alignment and exposure apparatus for aligning an alignment mark of a mask with an alignment mark of a wafer and for exposing, to a pattern of the mask, a resist material layer provided on the surface of the wafer, said method comprising:

a latent image forming step, performed by latent image forming means, for forming a latent image of the alignment mark of the mask on the resist material layer provided on the surface of the wafer by using first radiation from a radiation source;

a resist removing step for removing at least a portion of the resist material layer on the alignment mark of the wafer by using second radiation from a radiation source; and a detecting step for detecting the alignment mark of the wafer, the resist material of which has been at least partially removed by the irradiation with the second radiation, and the latent image of the alignment mark of the mask formed by said latent image forming means, wherein said latent image forming step and said resist removing step are executed at the same time.

9. A method according to claim 8, wherein said first radiation used in said latent image forming step and said second radiation used in said resist removing step are supplied from a common radiation energy source.

10. A method according to claim 8, wherein said first and second radiation are directed through the mask to the resist layer on the wafer and wherein said first radiation and said second radiation pass through first and second portions, respectively, of the mask.

11. A method according to claim 10, wherein the second portion of the mask through which said second radiation passes has a transmission factor which is higher than that of the first portion of the mask through which said first radiation passes, and wherein said first radiation and said second radiation are supplied from a common radiation energy source.

12. A method according to claim 8, wherein said removing step removes at least a portion of the resist material layer on the alignment mark of the wafer by vaporization of resist material, comprising the resist material layer, with irradiation with a radiation energy.

13. An alignment method, usable in a projection exposure apparatus for transferring a pattern of a reticle onto a resist layer formed on a wafer, for aligning the reticle with the wafer, said method comprising the steps of:

transferring a mark of the reticle onto the wafer by use of a projection optical system to form a latent image of the mark of the reticle in the resist layer of the wafer;

irradiating at least a portion of the resist layer on an alignment mark provided on the wafer with a predetermined radiation to remove an irradiated portion of the resist layer;

observing, by use of an observation optical system provided proximate to the projection optical system, (i) the alignment mark of the wafer wherein the resist layer has been removed, and (ii) the latent image of the mark of the reticle having been formed on the wafer; and adjusting the position of at least one of the reticle and the wafer on the basis of the positional relationship between the alignment mark of the wafer and the latent image of the reticle formed on the wafer, having been obtained from said observing step to align the reticle and the wafer with each other, wherein said mark transfer step and said resist removing step are executed substantially simultaneously.

14. A mark detecting method usable with a mask having an alignment mark and a wafer having an alignment mark wherein the wafer has a surface provided with a resist material layer thereon, said method comprising the steps of:

forming a latent image of the alignment mark of the mask on the resist material layer provided on the wafer by using radiation from a radiation source;

removing at least a portion of the resist material layer on the alignment mark of the wafer by using radiation from a radiation source; and detecting the alignment mark of the wafer, the resist material of which has been at least partially removed by the irradiation, and the latent image of the alignment mark of the mask formed on the wafer by said latent image forming step, wherein said latent image forming step and said resist removing step are executed substantially simultaneously.

15. A method of detecting the position of an object with respect to a reference pattern, wherein the object has a mark and a surface layer covering the mark, said method comprising the steps of:

forming a latent image of the reference pattern on the object;

removing a portion of the material of the surface layer of the object about the mark so that the mark is substantially uncovered; and observing, after the removing step, the latent image of the reference pattern and the mark of the object to detect the position of the object with respect to the reference pattern, wherein said latent image forming step and said resist removing step are executed substantially simultaneously.

16. A method according to claim 15, wherein said removing step comprises the step of removing the portion of the material of the surface layer about the mark by projecting radiation energy to the portion of the material of the surface layer about the mark.

17. A method according to claim 15, wherein the object is a semiconductor wafer and the reference pattern is formed on mask having a circuit pattern to be transferred to the wafer, and wherein said forming step comprises the step of forming the latent image of the reference pattern by use of a projection optical system for projecting the circuit pattern of the mask to the wafer.

18. A method to claim 17, wherein said observing step comprises the step of observing the mask of the wafer in a dark field while observing the latent image of the reference pattern formed on the wafer in a light field.

19. An exposure apparatus for exposing with radiation a wafer having a mark and a surface layer covering the mark, said apparatus comprising:

means for exhibiting a reference pattern;

means for forming a latent image of the reference pattern on the wafer;

means for removing a portion of the material of the surface layer of the wafer about the mark so that the mark is substantially uncovered;

means for observing, after the removing of the portion of the material of the surface layer of the wafer about the mark, the latent image of the reference pattern and the mark of the wafer to detect the position of the object with respect to the reference pattern; and means for adjusting the position of the wafer on the basis of the observing by said observing means, wherein said latent image forming means and said removing means comprise a common radiation source for the latent image formation and the material removal, respectively.

20. An apparatus according to claim 19, wherein said removing means removes the portion of the material of the surface layer about the mask by use of a radiation energy supplied from said radiation source.

21. An apparatus according to claim 19, wherein said forming means and said removing means are operable substantially simultaneously to execute the formation of the latent image and the removal of the portion of the material.

22. A method of detecting a positional relationship between a mask having an alignment pattern and a wafer having an alignment mark and being covered with a resist, said method comprising the steps of:

projecting first radiation energy to the wafer through the mask to print a latent image of the alignment pattern of the mask in a portion of the resist and, substantially simultaneously, projecting second radiation energy, stronger than the first radiation energy, to the wafer to remove a portion of the resist covering the alignment mark of the wafer; and detecting the positional relationship between the uncovered alignment mark of the wafer and the latent image of the alignment pattern of the mask formed in the resist of the wafer.

23. A method of detecting a positional relationship between a mask having an alignment pattern and a wafer having an alignment mark and being covered with a resist, said method comprising the steps of:

providing a single radiation source;

projecting first radiation energy from the radiation source to the wafer through the mask to print a latent image of the alignment pattern of the mask in a portion of the resist;

projecting second radiation energy, stronger than the first radiation energy, to the wafer to remove a portion of the resist covering the alignment mark of the wafer; and detecting the positional relationship between the uncovered alignment mark of the wafer and the latent image of the alignment pattern of the mask formed in the resist of the wafer.

24. In a semiconductor device manufacturing method in which the positional deviation of a wafer having an alignment mark and being covered with a resist, with respect to a mask having an alignment pattern and a circuit pattern, is detected and, after correction of the positional deviation, the wafer is exposed to the circuit pattern of the mask with radiation, the improvements comprising the steps of:

projecting first radiation energy to the wafer through the mask to print a latent image of the alignment pattern of the mask in a portion of the resist and, substantially simultaneously, projecting second radiation energy, stronger than the first radiation energy, to the wafer to remove a portion of the resist covering the alignment mark of the wafer; and detecting the positional relationship between the uncovered alignment mark of the wafer and the latent image of the alignment pattern of the mask formed in the resist of the wafer.

25. A method according to claim 24, further comprising the steps of:

supplying the first and second radiation energies from an excimer laser and exposing the wafer to the circuit pattern of the mask by using a laser beam from the excimer laser.

26. In a semiconductor device manufacturing method in which the positional deviation of a wafer having an alignment mark and being covered with a resist, with respect to a mask having an alignment pattern and a circuit pattern, is detected and, after correction of the positional deviation, the wafer is exposed to the circuit pattern of the mask with radiation, the improvements comprising the steps of:

providing a single radiation source;

projecting first radiation energy from the radiation source to the wafer through the mask to print a latent image of the alignment pattern of the mask in a portion of the resist;

projecting second radiation energy, stronger than the first radiation energy, to the wafer to remove a portion of the resist covering the alignment mark of the wafer; and detecting the positional relationship between the uncovered alignment mark of the wafer and the latent image of the alignment pattern of the mask formed in the resist of the wafer.

27. A method according to claim 26, wherein said providing step comprises the step of providing a radiation source comprising an excimer laser, and wherein said method further comprises the step of exposing the wafer to the circuit pattern of the mask by using a laser beam from the excimer laser.

* * * * *

UNITED STATES PATENT AND TRADEMARK OFFICE
CERTIFICATE OF CORRECTION

PATENT NO. : 5,160,957
DATED : November 3, 1992
INVENTOR(S) : HIDEKI INA, ET AL.

It is certified that error appears in the above-identified patent and that said Letters Patent is hereby corrected as shown below:

Title page, item
[73] ASSIGNEE

"Canon Kabushiki Kaisha, Tokyo,; 5
07221992 10099 11031992 JPX Japan
05091986 61-104843 27 1 1 Rutledge;
D. Adams; Russell E. 7 10 1"

should read --Canon Kabushiki Kaisha, Tokyo Japan--.

COLUMN 5

Line 58, "preferably" should read --referable--.

COLUMN 11

Line 1, "will be" should be deleted.

COLUMN 17

Line 41, "method" should read --method according--.

Signed and Sealed this

Ninth Day of November, 1993

Attest:

BRUCE LEHMAN

Attesting Officer        Commissioner of Patents and Trademarks